United States Patent [19]

Gordon et al.

[11] Patent Number: 4,914,055

[45] Date of Patent: Apr. 3, 1990

[54] SEMICONDUCTOR ANTIFUSE STRUCTURE AND METHOD

[75] Inventors: Kathryn E. Gordon, Palo Alto; Ching S. Jenq, San Jose, both of Calif.

[73] Assignee: Advanced Micro Devices, Inc., Sunnyvale, Calif.

[21] Appl. No.: 398,141

[22] Filed: Aug. 24, 1989

[51] Int. Cl.⁴ .......................................... H01L 21/283
[52] U.S. Cl. .................................. 437/192; 437/203; 437/245; 437/228
[58] Field of Search ............... 437/228, 192, 225, 245, 437/246, 203, 187, 189, 180, 173, 174, 19; 156/652, 653, 656, 657; 148/DIG. 51, DIG. 55

[56] References Cited

U.S. PATENT DOCUMENTS

| | | | |
|---|---|---|---|
| 4,240,094 | 12/1980 | Mader | 397/45 |
| 4,585,490 | 4/1986 | Raffel | 437/198 |
| 4,617,723 | 10/1986 | Mukri | 437/19 |
| 4,751,197 | 6/1988 | Wills | 437/174 |

Primary Examiner—Brian E. Hearn
Assistant Examiner—Kevin McAndrews
Attorney, Agent, or Firm—Flehr, Hohbach, Test, Albritton & Herbert

[57] ABSTRACT

A method for forming an array of antifuse structures on a semiconductor substrate which previously has had CMOS devices fabricated thereupon up to first metallization. A fuse structure is formed as a sandwich by successively depositing a bottom layer of TiW, a layer of amorphous silicon, and a top layer of TiW. The amorphous silicon is formed in an antifuse via formed in a dielectric layer covering the bottom layer of TiW. First metallization is deposited and patterned over the top layer of TiW. An intermetal dielectric layer is formed over the fuse array and second metal conductors are formed thereupon. An alternative embodiment includes forming an oxide sidewall spacer around the periphery of an antifuse structure. Connection resistance to the bottom layer of TiW is lowered by using a number of vias between the second-metal conductors and the bottom layer of TiW in a row of an array of antifuse devices.

7 Claims, 6 Drawing Sheets

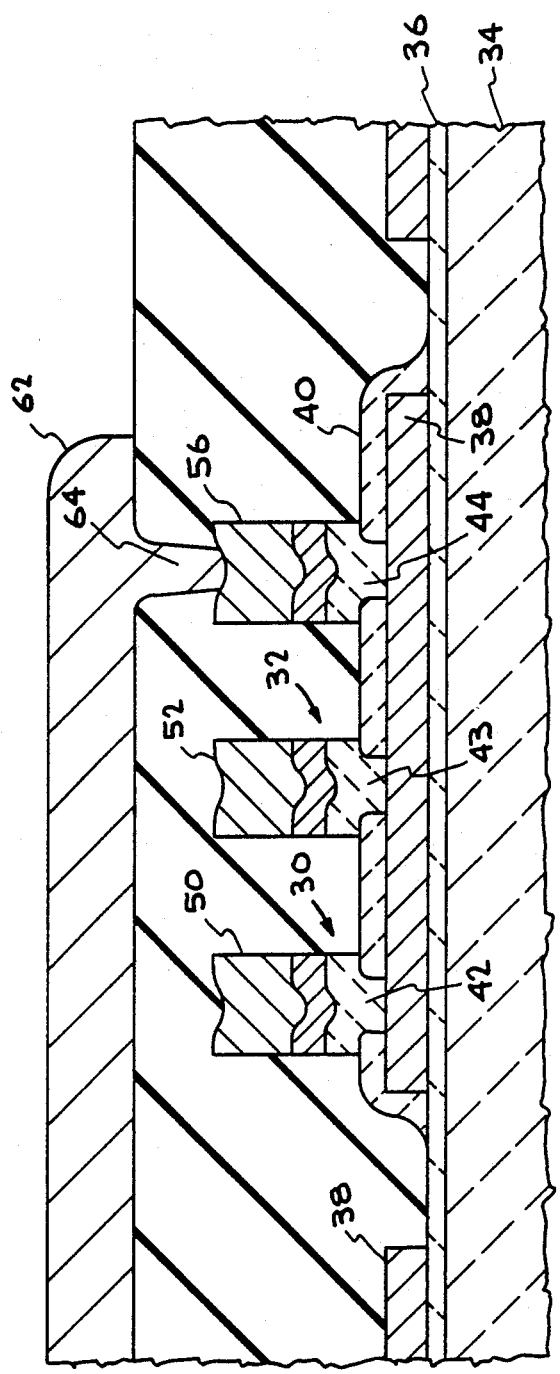
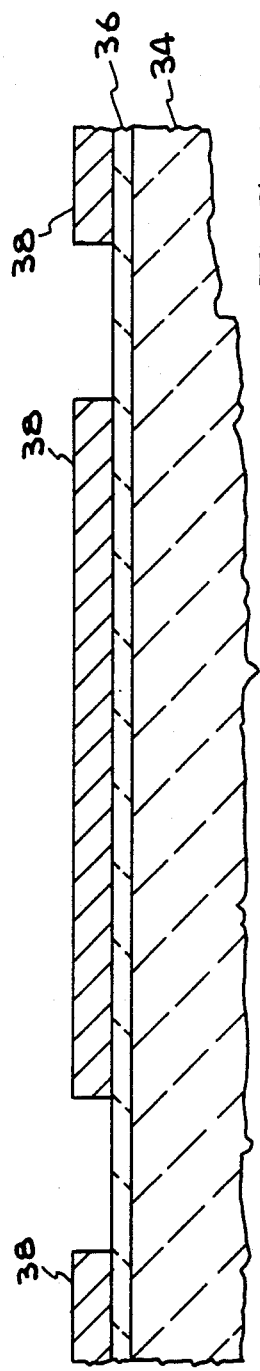

SEMICONDUCTOR ANTIFUSE STRUCTURE AND METHOD

BACKGROUND OF THE INVENTION

1. Field of the Invention

This invention relates to antifuse structures and methods for forming semiconductor antifuse structures.

2. Prior Art

An antifuse element is an electrically programmable device which is normally in an opencircuit, or high resistance, state. A programming signal changes an antifuse device to a low-resistance state. One type of antifuse is formed of high resistivity amorphous silicon which dramatically changes resistance upon application of an appropriate signal. The fusing mechanism is described as electrothermal switching. Once a critical value of an electric field is established across an amorphous or polycrystalline silicon film, a conductive filament having a relatively low resistance is formed in the film.

SUMMARY OF THE INVENTION

It is an object of the invention to provide an antifuse structure which has reduced resistance and reduced capacitance.

It is another object of the invention to provide an antifuse structure that is manufacturable with a CMOS process.

It is another object of the invention to provide an antifuse structure which has lower resistance connections to the fuse structure itself.

It is another object of the invention to provide an antifuse structure which permits use of a more controllable programming voltage by using amorphous silicon as a fuse material.

It is another object of the invention to provide an antifuse structure which provides a tight packing density in an array configuration.

In accordance with these and other objects of the invention, an antifuse structure is provided which includes a semiconductor substrate on which is formed a first bottom layer of TiW. A layer of a first dielectric material is formed on the first bottom layer of TiW, which has fuse vias formed therein to expose portions of the first layer of TiW. A layer of antifuse silicon material, preferably amorphous silicon is formed over the first layer of TiW and over portions of the first dielectric layer adjacent to the fuse vias.

A second layer of TiW is formed over the layer of amorphous silicon and a first metal conductor is formed over said second layer of TiW. The dielectric layer has connection vias formed therein to expose other portions of the first layer of TiW. A second metal layer is connected to the first layer of TiW through the connection vias to provide lower connection resistance to the first layer of TiW.

A plurality of antifuse structures are formed in an array on the semiconductor substrate. The respective first metal conductors for each device are arranged as strips extending and arranged generally parallel to each other. A strip of a first, or bottom, layer of TiW extends generally perpendicular to and is spaced apart from the first metal strips. Antifuse devices are located between and at crossover regions of the first metal conductors and the strip of first TiW. Vias formed through an intermetal dielectric layer to the first TiW provide reduced connection resistance for the antifuse structures.

Another embodiment of an antifuse structure include a first layer of TiW formed on the semiconductor substrate. A layer of antifuse silicon is formed on the first layer of TiW. A second layer of TiW is formed on the layer of amorphous silicon. The first and second layers of TiW and the layer of antifuse silicon form a vertical antifuse sandwich structure. A sidewall spacer is formed adjacent to and surrounds the periphery of the antifuse sandwich structure. A first metal layer overlies the sidewall spacer and the antifuse sandwich structures. A second metal is connected to the first TiW layer.

A method according to the invention is provided for forming an array of antifuse structures on a semiconductor substrate which has circuit elements formed thereon. The semiconductor substrate has been processed with CMOS process steps up to but not including the first metallization stage. The process of the invention begins at this stage and starts with depositing a first layer of TiW over the substrate, including over the circuit elements. Masking and etching of the first layer of TiW provides TiW bottom conductors for an array of antifuses and leaves a protective layer of TiW over the circuit elements. A first dielectric layer is then formed over the first layer of TiW. This layer is masked and etched to define an array of fuse vias in the first dielectric layer by exposing portions of said first layer of TiW. The first dielectric layer over the protective layer of TiW, which covers the circuit elements, is removed. A layer, preferably amorphous antifuse silicon, is deposited over the first dielectric layer and over exposed portions of the first layer of TiW at the fuse vias. A second layer of TiW is deposited over the layer of amorphous silicon. Masking and etching away portions of the second TiW layer and the layer of amorphous defines an array of fuse structures. The method then includes forming a protective layer over the array of fuses and removing the protective layer over the circuit elements. Finally, a first metal conductor is deposited over said second layer of TiW, said circuit elements, and said connection vias.

The method also includes forming an intermetal dielectric layer over the first metal conductor and forming vias in the intermetal dielectric layer to the first metal conductor and to the circuit elements. Second metal conductors are formed over said intermetal dielectric layers and a passivation layer is formed over the surface of the semiconductor substrate.

An alternative method of forming an antifuse structure includes the step of providing a silicon substrate which has been previously processed with CMOS process steps through contact formation and which has circuit elements formed thereon. The invention includes forming a protective layer over the circuit elements; masking and etching the protective layer away from a fuse area; depositing a first layer of TiW over the fuse area; depositing a layer of antifuse silicon material over the first layer of TiW; depositing a second layer of TiW over said layer of antifuse silicon material; masking and etching the first layer of TiW, the layer of antifuse silicon material, and the second layer of TiW to form a TiW-Si-TiW fuse sandwich. An oxide layer is etched to form a sidewall spacer around the periphery of the TiW-Si-TiW fuse sandwich. The method includes the further steps of removing the protective layer of TiW; depositing a layer of first conductor material over the second layer of TiW and over the circuit elements; etching portions of the layer of the first conductor material and the second layer of TiW; forming a via mask and etching standard connection vias to the layer of first conductor material and etching pick-up vias to the first layer of TiW; and depositing and etching a layer of second conductor material over the planarized dielectric layer. The protective layer is a layer of TiW or a layer of aluminum. The method also includes the step of depositing a layer of a barrier metal prior to depositing the layer of the conductor material over circuit elements.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 2 is a cross-sectional view of a semiconductor structure incorporating the antifuse invention.

FIGS. 3A-3E are cross-sectional views at various stages of the formation of the structure of FIG. 2.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims. Tee structures described are formed using well known semiconductor fabrication techniques.

Figure 1:
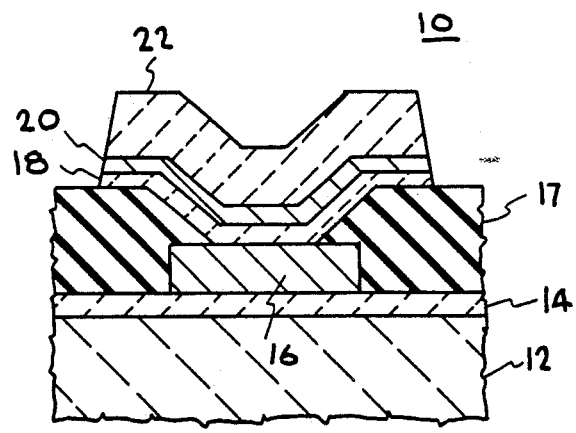
FIG. 1 is a cross-sectional view of an antifuse structure according to the invention.

FIG. 1 shows a basic antifuse structure 10 formed on a silicon substrate 12 that has been processed through standard CMOS process up through contact formation. A first layer of TiW 16 is formed by appropriate deposition, masking, and etching process steps on an oxide layer 14. A layer of dielectric material 17 is then deposited over the first layer of TiW 16 and a via pattern is formed therein to expose portions of the surface of the first layer of TiW 16. A layer of antifuse silicon 18, which is preferably amorphous or polycrystalline silicon, is formed over the first layer of TiW 16 within the via and over the areas of the dielectric layer 17 which are adjacent to the via. A second layer of TiW 20 is also formed over the layer of silicon 18. The two layers 16, 20 of TiW interspersed with the layer of silicon 16 form a structure which can be described as an antifuse sandwich. A layer of a first conductor material 22, such as aluminum doped with copper and silicon, is then formed to contact the second layer of TiW 20.

FIG. 2 shows two antifuse structures 30, 32 formed on a silicon semiconductor substrate 34 over an oxide layer 36, using process steps as illustrated with FIGS. 3A-3E.

FIG. 3A shows a first layer of 2400 Angstroms of TiW 38 deposited over the entire surface of the substrate and over one or more circuit elements (not shown) which are formed on the substrate by conventional semiconductor fabrication techniques using standard CMOS process including steps up to the first metal deposition. The TiW deposition serves two purposes: one, as a protective cover for CMOS transistors while an antifuse array is being formed and the other is to provide the bottom conductor of the fuses. Portions of the first layer of TiW 38 are appropriately masked and etched to define a TiW bottom conductor line 38 for the antifuses 30, 32, which are part of an array of such antifuses formed on the substrate.

Figure 3D:
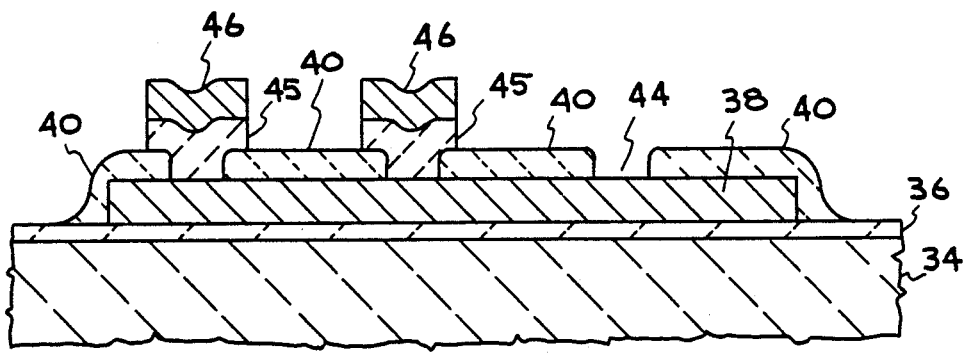
Figure 3E:
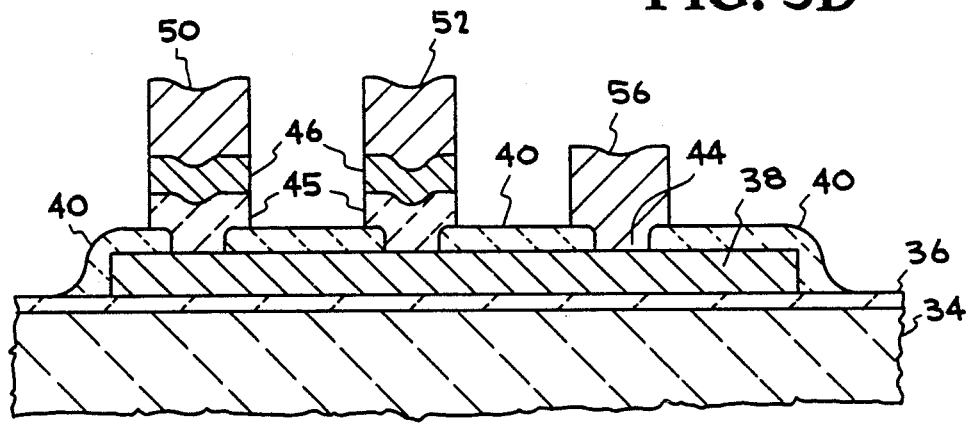
Figure 3B:
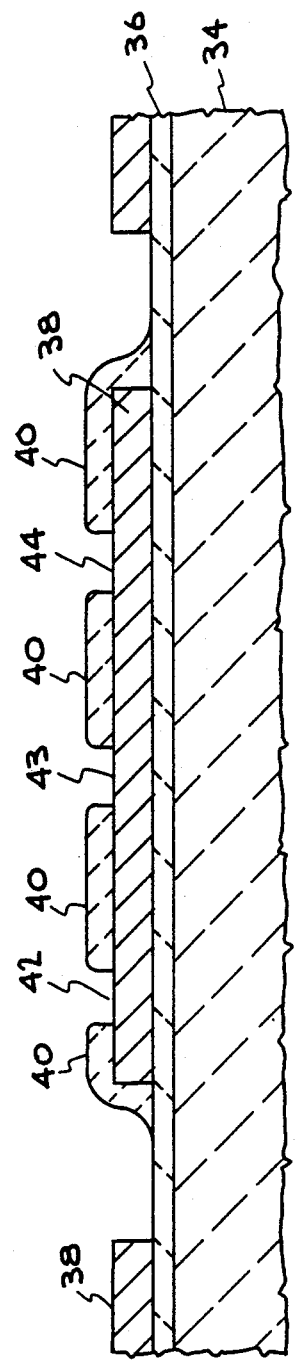

FIG. 3B shows a layer of dielectric material 40 such as 2000 Angstroms of oxide formed over the surface of the TiW layer 38 and then masked and etched to define as array of fuse vias and pick-up or connection vias, typically shown as 42, 43, 44. The vias expose various portions of the top surface of the first layer of TiW 38. The dielectric layer is removed over those portions of the first TiW layer which cover and protect the circuit elements.

Figure 3C:
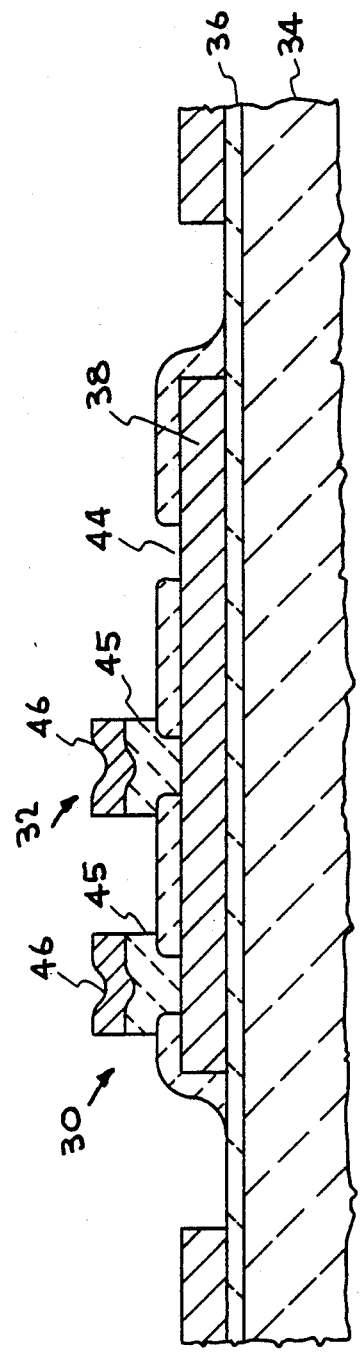

FIG. 3C shows a layer 45 of 1500 Angstroms of amorphous or polycrystalline silicon deposited over the substrate. A second layer of 1000 Angstroms of TiW 46 is then deposited over the silicon layer. The previous two layers are then masked and etched to define an array of vertical, sandwiched antifuse structures, such as typically shown as 30, 32. A photoresist mask in FIG. 3D is used to protect the fuse array while the TiW protecting the CMOS circuits is removed as shown in FIG. 3D. The wafer is now ready for first-metal aluminum.

FIG. 3E shows: conductors 50, 52 of a first conductive material, such as first-metal aluminum formed on the second layer of TiW for each respective antifuse structure when the first metallization for the integrated circuit components are also formed. The via 54 formed through the dielectric layer 40 to the surface of the first layer of TiW 38a is available. A conductor plug 56 of the first conductive material is also formed in the via and on adjacent areas of the dielectric layer 40, as shown, when the conductors 50, 52 are formed.

FIG. 2 shows a standard intermetal dielectric layer 60 is formed over the wafer. A conductor 62 of a second conductive material, such as, for example, second-metal aluminum, is also formed over the dielectric layer 60. The conductor 62 is formed when the second metallization for the integrated circuit components is also formed. A via 64 formed through the intermetal dielectric layer 60 permits the second conductor 62 to contact the conductor 56 to thereby provide external connection to the first layer of TiW 38. Alternatively, connection to the first layer of TiW 38 is made by not using the conductor plug 56 but by providing a via which extends all the way through the protective dielectric layer 60 and the dielectric layer 40 to the top surface of the first layer of TiW 38a. The conductor 62 of the second conductive material then extend all the way to the top surface of the first layer of TiW.

Figure 4:
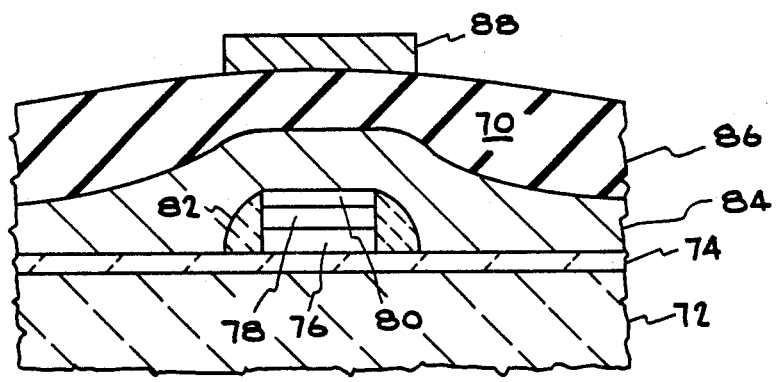
FIG. 4 is a cross sectional view of an alternative embodiment of a semiconductor structure incorporating the invention.

FIG. 4 shows an alternative embodiment of an antifuse structure 70 formed on a silicon semiconductor substrate 72 that has been processed through standard CMOS process steps up through contact formation. The antifuse structure 70 is fabricated as a sandwich structure. A first layer of TiW 76 is formed on the substrate. A layer 78 of preferably amorphous silicon or polysilicon is formed on the first layer of TiW 76. A second layer of TiW 80 is formed over the silicon layer 78. A silicon dioxide sidewall spacer 82 is formed to surround the periphery of the sandwich structure. A first metal, or conductive layer, 84 is formed over the top surface of the second layer of TiW 80 and the sidewall spacer 82. A standard intermetal dielectric layer 86 is formed over the first metal layer 84. A second metal aluminum layer 88 is formed and patterned over the standard dielectric layer 86. The second metal connects the first TiW layer through vias at regular intervals on a fuse array. The second TiW is removed between adjacent first metal lines as the first metal is patterned, thus forming self-aligned vertical fuse structures.

Figure 5B:
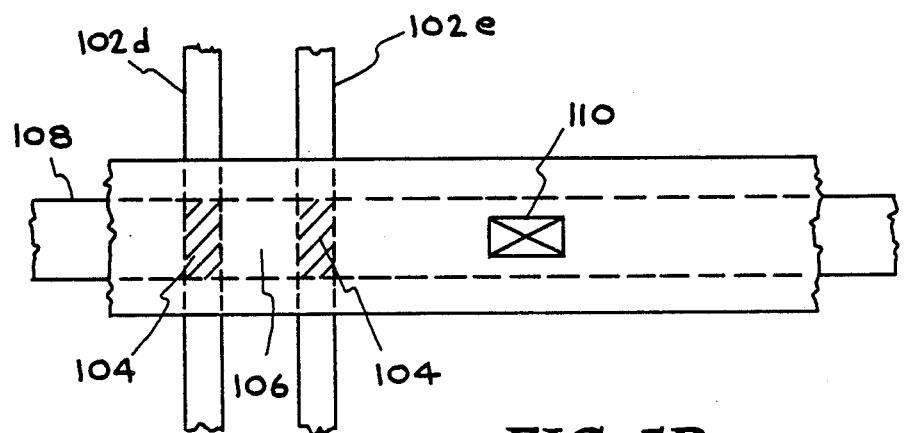
FIGS. 5A and 5B are plan views of portions of an array of antifuses.
Figure 5A:
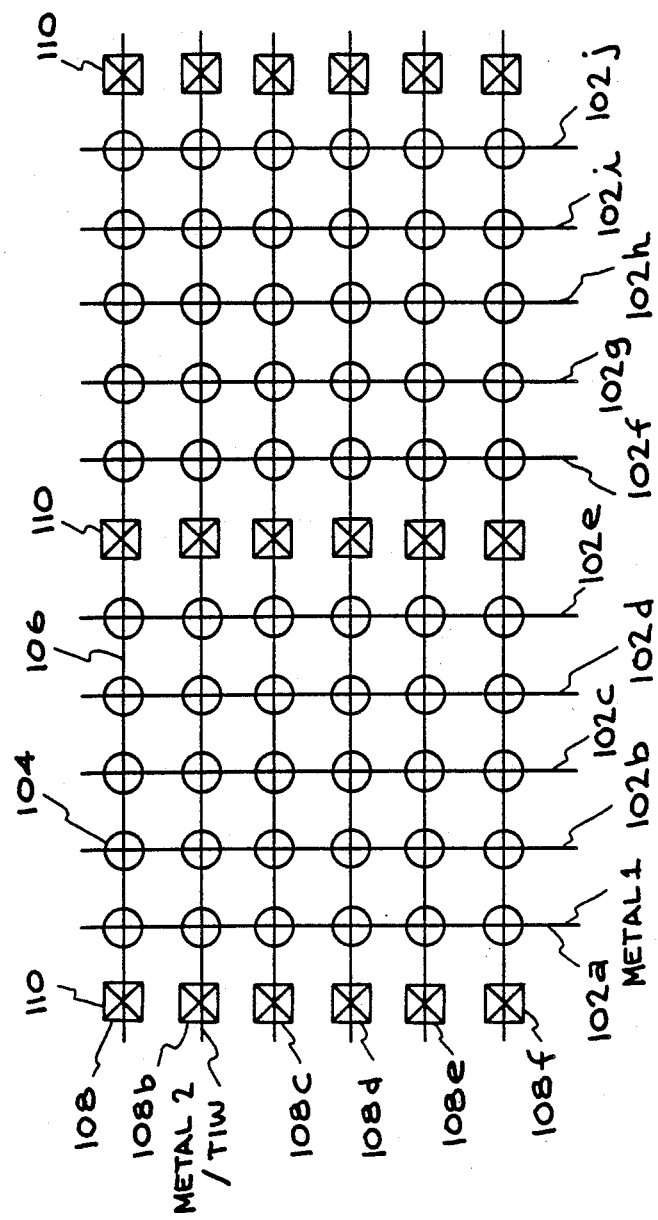

FIGS. 5A and 5B (in more detail) show partial plan views of some of the elements of a portion of an array of antifuse devices, such as shown in cross-section in FIG. 2 and as shown in cross-section in FIG. 4. A number of first-metal aluminum conductors (typically shown as 102a-102j) are formed as parallel strips with a certain pitch, or spacing, therebetween. Beneath the first metal conductors are formed antifuse structures (typically indicated as 104) each of which has a second layer of TiW beneath the first metal conductors. When the first metal aluminum layer is masked and etched, the TiW in the areas 106 between the antifuses 104 is also removed to leave only amorphous silicon areas 106 between the antifuses 104. This provides a row of self-aligned antifuses, spaced apart by the first metal pitch, as shown in the FIGURES. Additional rows of antifuses are located parallel to that row of antifuses. A second-metal aluminum conductor 108, crosses over and is perpendicular to the first metal conductors 102. A via 110 (typically shown) extends from the second metal conductors (typically shown as 108a-108f) to respective first layer of TiW at the bottom of the antifuse structure. The vias provide a plurality of connections between the second-metal conductor and the first TiW for a row of antifuse structures. This provides a reduced-resistance connection for the antifuse structures. Consequently, TiW is usable for the bottom conductor of the antifuses while still having lower connection resistances.

FIG. 5A shows the vias 110 spaced apart every 5 antifuses, or 6 metal-one pitches. In the prior art, external connections, using metal-two conductors to the bottom TiW layer would be made only at an end of a bottom conductor line. Using TiW in that connection arrangement would result in higher resistance connections. Using a number of connection vias for second-metal connections, as indicated in the drawing significantly reduces the connection resistance to any one of the antifuse structures.

FIGS. 6A-6D show various process stages in the formation of an antifuse structure elements forming an array of antifuses similar to those shown in FIG. 4.

Figure 6A:
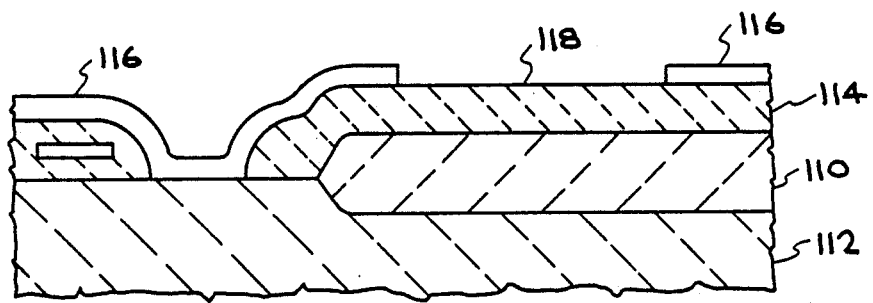
FIGS. 6A through 6D are cross-sectional views showing various stages in the formation of an antifuse according to the invention.

FIG. 6A shows a standard CMOS-processed wafer, processed up to first metallization. Over the surface of the substrate is then formed a protective layer 116 preferably 500-1000 Angstroms of TiW, or aluminum, to protect various previously formed circuit components and active devices formed on the substrate. A masking and etching step removes that portion of the protective layer 116 in the fuse area 118 in which a fuse structure is to be formed.

Figure 6B:
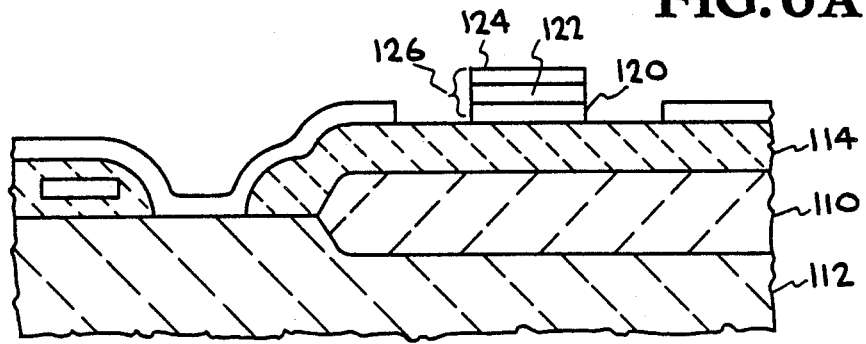

FIG. 6B shows a first layer 120 of 2500 A of TiW deposited in the fuse area 118. A layer 122 of 1000-2000 A of amorphous or polysilicon is deposited over the TiW layer 120. A second layer 124 of 1000-2000 A of TiW is deposited on the layer 122. A masking and etching step is then used to etch the TiW layers 120, 124 and the silicon layer 122 to form a vertical antifuse sandwich 126 as indicated in the drawing.

Figure 6C:
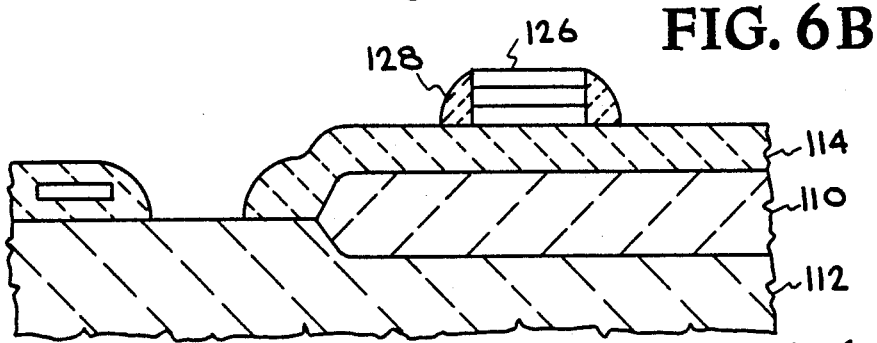

FIG. 6C shows the fuse structure 126 with an oxide sidewall spacer 128 surrounding the periphery of the fuse structure. The sidewall spacer 128 is formed by a plasma oxide deposition over the fuse structure. A subsequent isotropic etching of the oxide layer produces the sidewall 128 as shown. A photoresist mask is used to protect fuse structure as protective TiW is wet etched off of circuit elements. The wafer is now ready for standard first metallization.

Figure 6D:
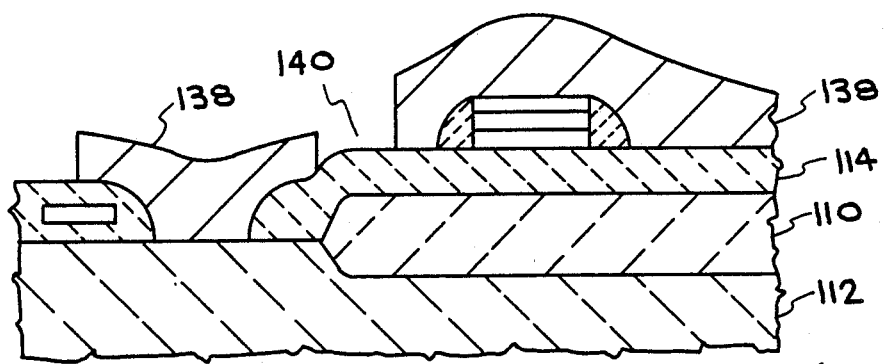

FIG. 6D shows a first-metallization layer of aluminum 138 deposited over the surface of the substrate. A barrier metal could be used if needed for CMOS circuit elements. A first metal masking and etching step etches away the aluminum 138 in the area 140 as shown to form the structure shown in FIG. 6D. The TiW 124 is also etched during the aluminum 138 etch. The next steps are conventional in semiconductor fabrication. A planarized dielectric layer is then deposited over the surface of the substrate. A via masking and etching step then forms standard vias to the aluminum conductors and pick-up vias to the TiW layer 120. A standard second metallization step is then used.

There are some advantages of the alternative method associated with the structure of FIGS. 4 and 6A-6D. The TiW-Si-TiW structure is planar and provides more uniform electric fields across an antifuse structure during programming. The bottom TiW not etched or damaged prior to Si deposition. The pitch, or spacing, of the fuse array elements is as dense as the pitch of the first metallization because of the self-alignment characteristic of the process described. The fuse and first metal are completely self-aligned. The circuit contacts are protected from all etching steps. Therefore, no change in the contact shape occurs.

Other barrier metals could be used, instead of TiW, for example, TiN or W. The protection layer over the circuit elements could be other metals such as aluminum.

The foregoing descriptions of specific embodiments of the present invention have been presented for purposes of illustration and description. They are not intended to be exhaustive or to limit the invention to the precise forms disclosed, and obviously many modifications and variations are possible in light o the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method of forming an array of antifuse structures on a semiconductor substrate having circuit elements formed thereon, comprising the steps of:

providing a semiconductor substrate which has been processed with CMOS process steps up to but not including first metallization;

depositing a first layer of TiW over said substrate, including over said circuit elements;

masking and etching said first layer of TiW to provide TiW bottom conductors for said array of antifuses and to leave a protective layer of TiW over said circuit elements;

forming a first dielectric layer over said first layer of TiW;

masking and etching away portions of said first dielectric layer to define an array of fuse vias in said first dielectric layer and to define connection vias for connection of said first layer of TiW to subsequently deposited second metal conductors by exposing portions of said first layer of TiW;

removing the first dielectric layer over the protective layer of TiW over said circuit elements;

depositing a layer of antifuse silicon over said first dielectric layer and over said exposed portions of said first layer of TiW;

depositing a second layer of TiW over said layer of antifuse silicon;

masking and etching away portions of said second TiW layer and said layer of antifuse silicon to define an array of fuses;

forming a protective photoresist layer over said array of fuses and removing said protective TiW layer over said circuit elements;

depositing a first-metal conductor over said second layer of TiW, said circuit elements, and said connection vias;

forming an intermetal dielectric layer over said first metal conductor;

forming vias in said intermetal dielectric layer to said first metal conductor;

forming second-metal conductors over said intermetal dielectric layer to provide a plurality of connections between said second metal conductors and said first layer of TiW to reduce connection resistance to said antifuse structures; and forming a passivation layer over the surface of the semiconductor substrate.

2. A method of forming an array of antifuse structures on a semiconductor substrate having circuit elements formed thereon, comprising the steps of:

providing a semiconductor substrate which has been processed with CMOS process steps up to but not including first metallization;

depositing a first layer of TiW over said substrate, including over said circuit elements;

masking and etching said first layer of TiW to provide TiW bottom conductors for said array of antifuses and to leave a protective layer of TiW over said circuit elements;

forming a first dielectric layer over said first layer of TiW;

masking and etching away portions of said first dielectric layer to define an array of fuse vias in said first dielectric layer;

removing the first dielectric layer over the protective layer of TiW over said circuit elements;

depositing a layer of antifuse silicon over said first dielectric layer and over said exposed portions of said first layer of TiW;

depositing a second layer of TiW over said layer of antifuse silicon;

masking and etching away portions of said second TiW layer and said layer of antifuse silicon to define an array of fuses;

forming a protective photoresist layer over said array of fuses and removing said protective TiW layer over said circuit elements;

depositing a first-metal conductor over said second layer of TiW, said circuit elements, and said connection vias;

forming an intermetal dielectric layer over said first metal conductor;

forming vias in said intermetal dielectric layer to said first metal conductor and to said first TiW layer;

forming second-metal conductors over said intermetal dielectric layer to provide a plurality of connections between said second metal conductors and said first layer of TiW to reduce connection resistance to said antifuse structures; and forming a passivation layer over the surface of the semiconductor substrate.

3. A method of forming an antifuse structure comprising the steps of:

providing a silicon substrate which has been processed with CMOS process steps through contact formation and which has circuit elements formed thereon;

forming a protective layer over the circuit elements;

masking and etching said protective layer away from a fuse area;

depositing a first layer of TiW over said fuse area;

depositing a layer of antifuse silicon material over said first layer of TiW;

depositing a second layer of TiW over said layer of antifuse silicon material;

masking and etching said first layer of TiW, said layer of antifuse silicon material, and said second layer of TiW to form a TiW-Si-TiW antifuse sandwich;

depositing an oxide layer and etching a sidewall spacer from said oxide layer around the periphery of said TiW-Si-TiW antifuse sandwich;

removing the protective layer;

depositing a layer of first conductor material over said second layer of TiW and over said circuit elements;

etching portions of the layer of the first conductor material and said second layer of TiW;

forming a planarized dielectric layer over said substrate;

forming a via mask and etching standard vias to said layer of first conductor material and etching pick-up vias to said first layer of TiW; and depositing and etching a layer of a second conductor material over said planarized dielectric layer.

4. The method of claim 3 wherein said protective layer is a layer of TiW.

5. The method of claim 3 wherein said protective layer is aluminum.

6. The method of claim 3 including the step of depositing a layer of a barrier metal prior to depositing the layer of first conductor material over circuit elements.

7. The method of claim 3 wherein said antifuse silicon is a layer of amorphous silicon.

* * * * *